United States Patent [19]

Crivello

[11] 4,239,725

[45] Dec. 16, 1980

[54] LOW TEMPERATURE CURABLE ORGANIC RESIN COMPOSITIONS

[75] Inventor: James V. Crivello, Clifton Park, N.Y.

[73] Assignee: General Electric Company, Schenectady, N.Y.

[21] Appl. No.: 122,280

[22] Filed: Feb. 19, 1980

Related U.S. Application Data

[60] Division of Ser. No. 58,318, Jul. 17, 1979, and a continuation-in-part of Ser. No. 962,997, Nov. 22, 1978, which is a continuation-in-part of Ser. No. 861,127, Dec. 16, 1977, abandoned.

[51] Int. Cl.$^3$ .............................................. C08F 4/44
[52] U.S. Cl. .................................. 264/328.6; 264/53; 264/331; 264/DIG. 83; 521/99; 521/101; 521/125; 521/154; 521/178; 521/181; 521/182; 526/273; 526/290; 528/92; 528/139; 528/275; 528/361; 528/409

[58] Field of Search ......... 264/53, 328, 331, DIG. 83; 526/273, 290

[56] References Cited

U.S. PATENT DOCUMENTS 3,691,133  9/1972  Sura ....................................... 528/88

*Primary Examiner*—Morton Foelak
*Attorney, Agent, or Firm*—William A. Teoli; James C. Davis, Jr.

[57] ABSTRACT

Low temperature curable organic resin compositions, for example, epoxy resins are provided, which can be either exothermically cured or cured in several minutes or less at relatively low temperatures. Certain diaryliodonium salts have been found to spontaneously release strong protonic acids when used in combination with a copper salt and a reducing agent.

8 Claims, No Drawings

LOW TEMPERATURE CURABLE ORGANIC RESIN COMPOSITIONS

CROSS REFERENCE TO RELATED APPLICATIONS

This is a division of application Ser. No. 058,318, filed July 17, 1979 now pending.

This application is a continuation-in-part of my copending application Ser. No. 962,997, filed Nov. 22, 1978, which is a continuation-in-part of abandoned application Ser. No. 861,127, filed Dec. 16, 1977, which are assigned to the same assignee as the present invention. Additional related applications are copending application Ser. No. 861,128, filed Dec. 16, 1977, Ser. No. 689,247, filed May 24, 1976, now abandoned, copending application Ser. No. 940,564, filed Sept. 8, 1978 and copending application Ser. No. 34,372, filed Apr. 30, 1979, which also are assigned to the same assignee as the present invention.

BACKGROUND OF THE INVENTION

The present invention relates to low temperature curable organic resin compositions based on the use of a diaryliodonium salt, a copper salt and a reducing agent, for example, ascorbic acid, an $Sn^{+2}$ compound, an activated α-hydroxy compound, etc. More particularly, the present invention relates to low temperature curable compositions useful in reaction injection molding applications.

As shown in my copending application Ser. No. 962,997, filed Nov. 22, 1978 and assigned to the same assignee as the present invention, aromatic iodonium salts can be employed in combination with organic acids or copper salts to facilitate the heat cure of various organic materials, such as epoxy resins. I have also found, as shown in my copending application Ser. No. 940,564, filed Sept. 8, 1978 and assigned to the same assignee as the present invention, that valuable results also can be achieved if reducing agents, such as thiophenol are used in combination with aryl onium salts to facilitate the thermal cure of epoxy resins. Surprisingly, in the absence of such cocatalysts, the cure of cationically polymerizable organic materials, such as epoxy resins, with an aromatic iodonium salt can require temperatures exceeding 200° C. over an extended period of time. I have now discovered that if a diaryliodonium salt of the formula, $$[(R)_a(R^1)_b I]^+ [Y]^-  \quad (1),$$

is employed with a catalyst comprising a mixture of copper salt, and a reducing agent defined more particularly hereinafter, the cure of a cationically polymerizable organic material, for example, an epoxy resin can be achieved spontaneously, or in a few minutes or less without the use of external heat, or initiated at a relatively low temperature, where R is a monovalent aromatic organic radical, $R^1$ is a divalent aromatic organic radical, Y is a non-nucleophilic anion defined below, a is a whole number equal to 0 or 2, b is a whole number equal to 0 or 1, and when a is 0, b is 1, and when b is 0, a is 2. A possible cure mechanism is that a strong protonic acid is released based on the spontaneous breakdown of the diaryliodonium salt.

SUMMARY OF THE INVENTION

There is provided by the present invention, curable compositions comprising by weight,
(A) a cationically polymerizable organic resin, and
(B) an effective amount of the curable composition of a catalyst consisting essentially of
 (i) a diaryl iodonium salt,
 (ii) 0.1 to 10 parts, per part of (i) of a copper salt and
 (iii) 0.5 part to 10 parts, per part of (i) of a reducing agent.

Anions included by Y of formula (I) are, for example, $MQ_d$, where M is a metal or metalloid, Q is a halogen radical and d is an integer having a value of from about 4–6 inclusive. In addition to epoxy resins, formula (1) iodonium salts also have been found to be useful in curing cyclic ethers, lactones, lactams and cyclic acetals, etc., where the iodonium salts also can have non-nucleophilic counterions such as perchlorate, $CF_3SO_3^-$ and $C_6H_4SO_3^-$. Again, the cationically polymerizable material can be a phenol-formaldehyde, urea-formaldehyde or melamineformaldehyde resin, Y of formula (1) also can include in addition to $MQ_d$ and other non-nucleophilic counterions previously recited, halide counterions such as Cl, Br, F and I as well as nitrate, phosphate, etc.

Radicals included by R of formula (1) can be the same or different aromatic carbocyclic or heterocyclic radicals having from 6 to 20 carbon atoms, which can be substituted with from 1 to 4 monovalent radicals selected from $C_{(1-8)}$ alkoxy, phenyl, chlorophenyl, nitrophenyl, methoxyphenyl, pyridyl, etc. Radicals included by $R^1$ are divalent radicals such as

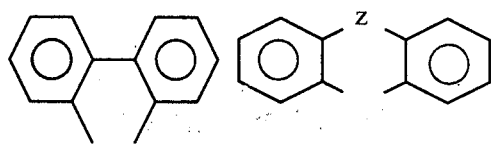

etc., Z can be —O—, —S—,

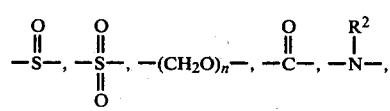

$R^2$ is $C_{(1-8)}$ alkyl or $C_{(6-13)}$ aryl and n is an integer equal to 1–8 inclusive.

In another aspect of the present invention, there is provided a method for molding a shaped part from a cationically polymerizable organic material which comprises
(1) blending under reaction injection molding conditions a mixture comprising by weight
 (C) a cationically polymerizable organic material, and
 (D) an effective amount of a catalyst comprising
  (iv) a diaryliodonium salt
  (v) 0.1 to 10 parts, per part of (iv) of a copper salt and
  (vi) 0.5 part to 10 parts, per part of (iv) of a reducing agent,
(2) injecting the resulting mixture of (1) into a heated mold, and (3) recovering the molded part resulting from step (2).

The copper salts which can be used in the practice of the invention include for example, copper I and copper II salts, for example, carboxylic acid and mineral acid copper salts such as Cu(I) bromide, Cu(I) chloride, Cu(II) benzoate, Cu(II) citrate, Cu(II) formate, Cu(II) acetate, Cu(II) stearate, Cu(II) oleate, Cu(II) carbonate, Cu(II) gluconate, etc.

The term "reducing agent" as used in the definition of the present invention includes any organic or inorganic compound or polymer capable of lowering or reducing the charge of the hetero atom of the diaryliodonium salt. There are included, for example, ascorbic acid and its derivatives, such as ascorboyl palmitate, ascorboyl oleate, ascorboyl acetate, etc.; tin ($Sn^{+2}$) compounds also can be used, for example, $Sn^{+2}$ carboxylic acid salts, e.g., stannous octoate, stannous stearate, stannous laurate, stannous citrate, stannous oxalate, stannous benzoate, etc. Among organic compounds there are included α-hydroxy compounds, for example, ketones such as acyloins and benzoins,

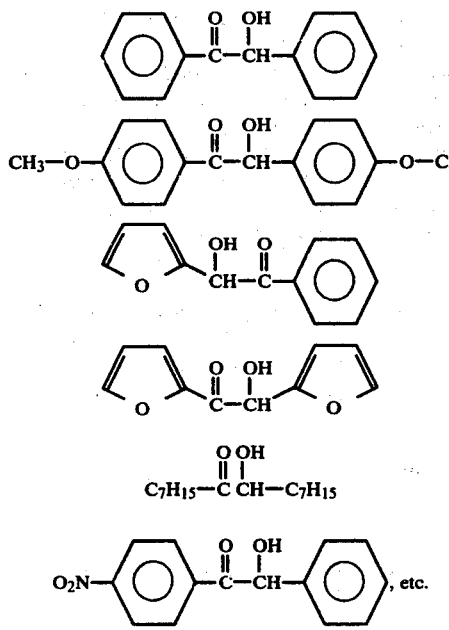

There are also included iron ($Fe^{+2}$) compounds, for example, ferrocene, $FeBr_2$, $FeCl_2$, etc; reducing sugars, such as glucose, fructose, galactose; etc., phenols, for example, thiophenol, etc.; silanes, for example, $Si(H)_c(R^2)_d$ compounds, where $R^2$ is defined above, c is an integer having a value of 1 to 4 inclusive, d is a whole number equal to 0 to 3, and the sum of $c+d=4$; SiH containing organosiloxane, etc.

In addition to ascorbic acid and α-hydroxy ketones, other activated α-hydroxy compounds which can be used with copper salts as defined above, are included by the following formula,

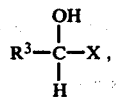

where $R^3$ is a $C_{(1-20)}$ alkyl radical, or $C_{(6-20)}$ aryl radical and X is a monovalent radical selected from the class of nitro, halo, sulfone, $CO_2R^4$, cyano,

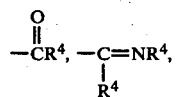

$-CCl_3$ and $CHCl_2$, where $R^4$ is selected from hydrogen and $R^3$.

The diaryliodonium salts of formula (1) and methods for making them are shown in Crivello patent 3,981,897, assigned to the same assignee as the present invention. Additional methods for making such diaryliodonium salts are shown by F. M. Beringer, R. A. Falk, M. Karmal, J. Lillien, G. Masullo, M. Mausner, E. Sommers, J. Am. Chem. Soc., 81 342 (1958) and I. Mason, Nature, 139 150 (1937); I. Mason and E. Race, J. Am. Chem. Soc., 1718 (1937).

Included by the cationically polymerizable materials which can be employed in the curable compositions of the present invention are, for example, epoxy resins which include any monomeric, dimeric or oligomeric or polymeric epoxy material containing one or a plurality of epoxy functional groups. For example, those resins which result from the reaction of bisphenol-A (4,4'-isopropylidenediphenol) and epichlorohydrin, or by the reaction of low molecular weight phenol-formaldehyde resins (Novolak resins) with epichlorohydrin, can be used alone or in combination with an epoxy containing compound as a reactive diluent. Such diluents as phenyl glycidyl ether, 4-vinylcyclohexene dioxide, limonene dioxide, 1,2-cyclohexene oxide, glycidyl acrylate, glycidyl methacrylate, styrene oxide, allyl glycidyl ether, etc., may be added as viscosity modifying agents.

In addition, the range of these compounds can be extended to include polymeric materials containing terminal or pendant epoxy groups. Examples of these compounds are vinyl copolymers containing glycidyl acrylate or methacrylate as one of the comonomers. Other classes of epoxy containing polymers amenable to cure using the above catalysts are epoxy-siloxane resins, epoxy-polyurethanes and epoxy-polyesters. Such polymers usually have epoxy functional groups at the ends of their chains. Epoxy-siloxane resins and method for making are more particularly shown by E. P. Plueddemann and G. Fanger, J. Am. Chem. Soc. 81 2632-5 (1959). As described in the literature, epoxy resins can also be modified in a number of standard ways such as reaction with amines, carboxylic acids, thiols, phenols, alcohols, etc., as shown in U.S. Pat. Nos. 2,935,488; 3,235,620; 3,369,055; 3,379,653; 3,398,211; 3,403,199; 3,563,850; 3,567,797; 3,677,995, etc. Further examples of epoxy resins which can be used are shown in the Encyclopedia of Polymer Science and Technology, Vol. 6, 1967, Interscience Publishers, New York, pp. 209-271.

Additional examples of the cationically polymerizable materials are, for example, vinyl organic monomers, vinyl organic prepolymers, cyclic organic ethers, cyclic organic esters, cyclic organic sulfides, organo silicon cyclics, etc. There are included, for example, styrene, vinyl acetamide, -methyl styrene, isobutyl vinylether, n-octyl vinylether, acrolein, 1,1-diphenylethylene, α-pinene, vinyl arenes such as 4-vinyl biphenyl, 1-vinylpyrene, 2-vinyl fluorene, acenaphthalene, 1 and 2-vinyl naphthalene; 9-vinyl carbazole, vinyl pyrrolidone, 3-methyl-1-butene; vinyl cycloaliphatics such as vinylcyclohexane, vinyl cyclopropane, 1-phenylvinylcyclopropane; dienes such as isobutylene, isoprene, butadiene, 1,4-pentadiene, etc.

Some of the vinyl organic prepolymers which can be used to make the polymerizable compositions of the present invention are, for example, $CH_2=CH-O-(CH_2-CH_2O)_m-CH=CH_2$, where m is a positive integer having a value up to about 1000 or higher; multifunctional vinylethers, such as 1,2,3-propane trivinyl ether, trimethylolpropane trivinyl ether, prepolymers having the formula,

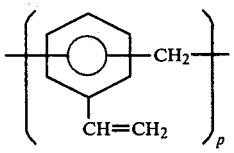

and low molecular weight polybutadiene having a viscosity of from 200 to 10,000 centipoises at 25° C., etc. Products resulting from the cure of such compositions can be used as potting resins, crosslinked coatings, printing inks and other applications typical of thermosetting or network resins.

A further category of the organic materials which can be used to make the polymerizable compositions are cyclic ethers which are convertible to thermoplastics. Included by such cyclic ethers are, for example, oxetanes such as 3,3-bischloromethyloxetane, alkoxyoxetanes as shown by Schroeter U.S. Pat. No. 3,673,216, assigned to the same assignee as the present invention; oxolanes such as tetrahydrofuran, oxetanes, oxygen containing spiro compounds, trioxane, dioxolane, etc.

In addition to cyclic ethers, there are also included cyclic esters such as β-lactones, for example propiolactone, cyclic amines, such as 1,3,3-trimethylazetidine and organosilicone cylics, for example, materials included by the formula,

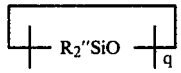

where R″ can be the same or different monovalent organic radicals such as methyl or phenyl and q is an integer equal to 3 to 8 inclusive. An example of an organosilicon cyclic is hexamethyl trisiloxane, octamethyl tetrasiloxane, etc. The products made in accordance with the present invention are high molecular weight oils and gums.

Included in the thermosetting organic condensation resins of formaldehyde which can be used in the practice of the present invention are, for example, urea type resins, such as

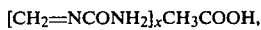

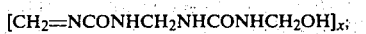

phenol-formaldehyde type resins, such as

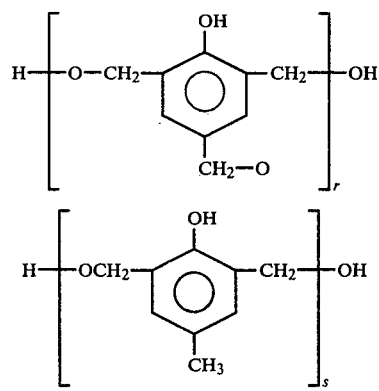

where r and s are integers having a value of 1 or greater;

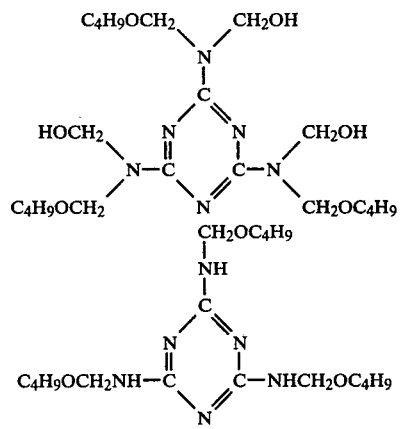

In addition, there can be used melamine thiourea resins, melamine, or urea aldehyde resins, cresol-formaldehyde resins and combinations with other carboxy, hydroxyl, amino and mercapto containing resins, such as polyester, alkyds and polysulfides.

In particular instances, depending upon the compatability of the halonium salt with the organic material, the halonium salt can be dissolved or dispersed in an organic solvent such as nitromethane, acetonitrile, methylene chloride, etc., prior to its incorporation into the organic material. Experience has shown that the proportion of halonium salt to organic metallic can vary widely inasmuch as the salt is substantially inert, unless activated. Effective results can be achieved, for example, if a proportion of at least 0.1% by weight of halonium salt is employed, based on the weight of polymerizable composition. Higher or lower amounts can be used, however, depending upon factors such as the nature of organic material, polymerization time desired, etc.

In the practice of the invention, the curable compositions can be made by effecting contact between the diaryliodonium salt, the cationically polymerizable organic resin and the redox system of the copper salt and the reducing agent, e.g. ascorbic acid.

Preferably, reaction injection molding in accordance with the practice of the invention is achieved by blending all the components of the curable composition immediately prior to injecting the total resulting blend into a mold. The components used in forming the curable compositions can be derived from two separate sources to effect a separation between the diaryliodonium salt, the copper salt and the reducing agent before the total mixture is injected into the mold.

A typical sequence, for example, is to have a component A consisting of the diaryliodonium salt and the epoxy resin in one container, and a mixture of the reducing agent, the copper salt and the epoxy resin in a separate container as component B. The curable mixture can then be formed by impingment mixing components A and B under pressure at a suitable viscosity, for example, 500 centipoises to 2500 centipoises at 25° C. and thereafter instantaneously injecting the resulting total mixture under pressure into a heated mold which can be at a temperature, for example, at between 80° C. to 200° C. or higher depending upon the rate at which cure is desired. Lower temperatures can be also utilized if the viscosity of the resulting mixture is within workable limits. Those skilled in the art can vary such parameters, such as temperature, pressure and viscosity depending upon the nature of the components of the mixture, the equipment utilized, etc. A typical heating period in the mold can be, for example, 20 seconds or less to about 5 minutes or more.

Experience has shown that an effective amount of the total catalyst comprising the diaryliodonium salt, the copper salt and the reducing agent can vary between 1% to 35% by weight based on the total weight of the low temperature curable organic resin composition. Suitable volatile organic solvents which can be employed to produce rigid or flexible foams in the practice of the present invention are, for example, acetone, hexane, trichlorofluoromethane, n-pentane, 2-methyl-hexane, dichloromethane, 1,1,2-trichlorotrifluoroethane, methyl alcohol, ethyl alcohol, methyl ethyl ketone, etc.

The foamable mixture can be cast molded into suitable receptacles, such as refrigerator doors and the like to provide for the production of insulating foams. Thorough mixing of the ingredients has been found to facilitate the production of a uniform foam which can be achieved by the employment of a mechanical stirrer or agitator, as generally utilized in the art.

In instances where a flexible foam is desired, the above described epoxy resin can be combined with polycaprolactones or any hydroxy terminated polyester to render the foams made in accordance with the present invention more flexible. Typical hydroxy terminated polycaprolactones are Niax polyols, manufactured by the Union Carbide Corporation. There can be utilized from 1 to 60 parts of the hydroxy terminated polyester, per part of the epoxy resin and preferably from 1 to 50 parts. Included by the hydroxy terminated polyester which can be employed in the practice of the present invention to flexibilize cured epoxy resin films or foams are compounds of the formula,

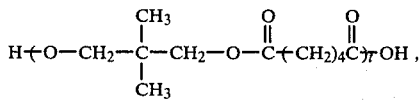

where t is an integer having an average value of from 1 to 100.

As previously indicated, the curable compositions of the present invention also can be used in coating applications or in the production of rigid or flexible parts. In addition to the cationically polymerizable organic resin which includes any of the aforementioned epoxy resins, as well as the organic cyclics as previously defined, as well as additives, such as caprolactones for flexibilizing the films and foams made therefrom, there also can be combined with such ingredients fillers in a proportion by weight of from 0 to 500 parts of such filler per 100 parts of the cationically polymerizable organic resin. Suitable fillers include, for example, talc, alumina, sand, silica, ground quartz, wood flour, carbon black, glass fibers, mica, barium sulfate, titanium dioxide, etc.

In addition, the above curable compositions may include additives to enhance surface properties and to control foam cell size. Among such additives are polyalkylene oxide surfactants and silicone fluids.

In order that those skilled in the art will be better able to practice the present invention, the following examples are given by way of illustration and not by way of limitation. All parts are by weight.

EXAMPLE 1

There was added a mixture of copper salt and ascorbic acid in n-butanol to a 3% solution of diphenyliodonium hexafluoroarsenate in 3,4-epoxycyclohexylmethyl-3',4'-epoxycyclohexanecarboxylate. A series of mixtures were made following the procedure using various copper compounds to produce mixtures having an average of from 1–3% by weight of the copper salt and from 0.5 to 3% by weight of ascorbic acid, based on the weight of the mixture. The cure time (sec) was recorded which represented the time for the respective mixtures to harden when examined in 4 dram vials. The following results were obtained where the percent shown is based on the weight percent of the ingredients in the mixture:

| Copper II Compound WT (%) | Ascorbic Acid WT (%) | Cure Time (sec) |
|---|---|---|
| — | — | No Cure |
| — | 3 | No Cure |
| Copper benzoate (3) | — | No Cure |
| Copper benzoate (3) | 3 | 380 |
| Copper benzoate (1) | .05 | 120 |
| Copper benzoate (1) | 1 | <60 |
| Copper stearate (1) | 1 | 60–120 |
| Copper acetate (3) | 3 | 30 |
| Copper formate (3) | 3 | 30 |
| Copper benzoate (1) | 2 | <30 |

The above results show the need for copper salts and ascorbic acid to achieve a cure of the epoxy resin and the effect on the cure time when the weight percent of the respective ingredient is varied at ambient conditions.

EXAMPLE 2

A study was made with a mixture of an epoxy resin containing 1% by weight of copper benzoate and 3% by weight of ascorbic acid to determine whether cure time would be affected by varying the type of diaryliodonium salt used. The redox catalyst was added as a suspension in ethylene glycol to the epoxy resin of Example 1 which contained 3% by weight of diaryliodonium salt. The following results were obtained:

| Diaryliodonium Salt | Cure Time (sec) |
|---|---|
| $[\text{C}_6\text{H}_5]_2\text{I}^+ \text{AsF}_6^-$ | 75 |
| $[\text{Cl-C}_6\text{H}_4]_2\text{I}^+ \text{AsF}_6^-$ | 114 |
| $[(\text{CH}_3)_3\text{C-C}_6\text{H}_4]_2\text{I}^+ \text{AsF}_6^-$ | 174 |
| $[\text{NO}_2\text{-C}_6\text{H}_4(\text{C}_6\text{H}_5)]\text{I}^+ \text{AsF}_6^-$ | 102 |
| $[(\text{CH}_3)_3\text{C-C}_6\text{H}_4]_2\text{I}^+ \text{SbF}_6^-$ | 190 |
| $[(\text{CH}_3)_3\text{C-C}_6\text{H}_4]_2\text{I}^+ \text{PF}_6^-$ | 300 |

The above results show that the structure of the anion and the cation of the diaryliodonium salt had a significant effect on the epoxy resin cure time at ambient conditions.

EXAMPLE 3

The procedure of Example 1 was repeated, except that 1% by weight of ascorboyl palmitate in 0.3% by weight n-butanol, based on the weight of the resulting curable composition, was used in place of ascorbic acid. It was found that the resulting composition cured within 3–4 minutes without the use of external heat under atmospheric conditions.

EXAMPLE 4

There was added 0.1 part of copper benzoate and 0.2 part of ascorbic acid in combination with 0.6 part of acetone to a mixture with stirring consisting of 6 parts of 3,4-epoxycyclohexylmethyl-3', 4'-epoxycyclohexane carboxylate and 0.2 part of diphenyliodonium hexafluoroarsenate. The mixture was stirred vigorously and then allowed to stand in a small container. After about 150 seconds, the mixture foamed and filled the container. There was obtained a rigid foam having a density of approximately 0.05 g/cc. The foam was suitable as a thermal insulator for a refrigerator.

The above procedure was repeated, except that Freon 11 was used in place of acetone. A foam was formed similar to the foam obtained using acetone.

EXAMPLE 5

A mixture of 6 parts of 3,4-epoxycyclohexylmethyl-3',4'-epoxycyclohexanecarboxylate and 3 parts of polycaprolactone, PCP0300, a product of the Union Carbide Corporation, was mixed with 0.2 part of diphenyliodonium hexafluoroarsenate, 0.1 part of copper benzoate, 0.2 part of ascorbic acid and 0.6 part of acetone. The mixture was vigorously stirred in a small glass container approximately ⅓-filled. In approximately 150 seconds the reaction mixture foamed and filled the container and then overflowed the container. The resulting foam was found to be flexible, based on the fact that it could be flexed at 180° without being permanently set. The density of the foam was approximately the same as in Example 4.

EXAMPLE 6

There was added to a 1.5% solution of diphenyliodonium hexafluoroarsenate in 2-chloroethylvinyl ether, 0.5% of copper benzoate and 0.5% of ascorbic acid. A vigorous reaction occurred within 3 minutes. The reaction mixture was then poured into methanol after standing an additional 15 minutes. There was obtained a 61.3% yield of polychloroethylvinyl ether after the resulting product was washed in methanol and dryed.

The above procedure was repeated, except that trimethyleneoxide was used in place of 2-chloroethylvinyl ether and the reaction was performed at 0° C. A 41.4% yield of polytrimethylene oxide was obtained.

EXAMPLE 7

There was added 0.3 part of copper benzoate and 0.3 part of ascorbic acid suspended in ethylene glycol to 9.4 parts of an acid reactive resole phenol formaldehyde based resin having allylic ether functional groups (Methylon 11 of the General Electric Company). The mixture was stirred thoroughly and poured into a shallow aluminum cup. After 30 minutes, the phenol formaldehyde resin was found to have cured to a hard rigid solid.

EXAMPLE 8

There were added 3 parts of stannous octoate and 3 parts of diphenyliodonium hexafluorophosphate to 100 parts of 3,4-epoxycyclohexylmethyl-3',4'-epoxycyclohexane carboxylate (CY 179, ERL4221) and the resulting mixture was thoroughly stirred. There was then added to the mixture, 0.05 part of a 12% solution of copper naphthenate to the resulting mixture while it was rapidly stirred. The mixture hardened and became rigid at room temperature within two minutes.

The above procedure is repeated, except that the mixture prior to hardening is poured into a silicone mold. There is obtained a finished part within two minutes conforming to the shape of the mold.

EXAMPLE 9

Several 10 part aliquots were prepared from a mixture of 70 parts of the epoxy resin of Example 8 and 30 parts of a hydroxyl terminated polyester resin (Rucoflex F2018, Hooker Chemical Company). Various amounts of diphenyliodonium hexafluorophosphate, copper naphthenate and stannous octoate were added to each of the 10 part aliquots. After each of the respective mixtures were thoroughly stirred they were allowed to stand at room temperature to determine how long it took for the mixtures to gel. The results are shown in Table I which shows the parts of the various ingredients used in the mixture, and "Cu(Naphth)₂" is copper naphthenate, and "Sn(Oct)₂" is stannous octoate.

TABLE I

| $(C_6H_5)_2I^+PF_6^-$ | $Cu(Naphth)_2$ | $Sn(Oct)_2$ | Gel Time (min) |
|---|---|---|---|
| 3 | 0.15 | 3 | 7.5 |
| 3 | 0.30 | 3 | 5.0 |
| 3 | 0.45 | 3 | 3.5 |
| 3 | 0.60 | 3 | 3.2 |
| 3 | 0.60 | 6 | 2.5 |

The above results show improved epoxy resin cure rate with increasing copper and tin salt concentration.

EXAMPLE 10

There was added to a mixture of 70 parts of Epon 828, a diglycidyl ether of bisphenol-A, and 30 parts of of Rucoflex F2018 hydroxy terminated ester, which was divided into 10 part aliquots. Various parts of stannous octoate, copper naphthenate in mineral oil and various diaryliodonium hexafluoroarsenate salts were used per each 10 part aliquot. The mixtures were stirred and allowed to stand at room temperature to determine cure time. The following results are shown in Table II, where "GT" is gel time, $Cu^{+2}$ is copper naphthenate and $Sn^{+2}$ is stannous octoate:

TABLE II

| Iodonium Salt (0.3 part) | $Sn^{+2}$ | $Cu^{+2}$ | GT (Min) |
|---|---|---|---|
| $[(C_6H_5)_2I]^+ AsF_6^-$ | 0.6 | .072 | 3.4 |
| $[CH_3\text{-}C_6H_4\text{-}I]_2^+ AsF_6^-$ | 0.3 | .054 | 9 |
| $[(CH_3)_2C_6H_3\text{-}I]_2^+ AsF_6^-$ | 0.3 | .054 | 9.75 |
| $[Cl\text{-}C_6H_4\text{-}I]_2^+ AsF_6^-$ | 0.3 | .054 | 10 |

EXAMPLE 11

A mixture of 100 parts of ERL4221, which is the epoxy resin utilized in Example 8, 30 parts of acetone, 6 parts of a 50% solution of diphenyliodonium hexafluoroarsenate in propylene carbonate, 3 parts of stannous octoate and 0.5 part of a 12% solution of copper naphthenate, along with 0.1 part of Cabosil fume silica was vigorously stirred in a container. The resulting stirred mixture was then allowed to stand at room temperature. In approximately 4 minutes, a vigorous polymerization occurred along with the production of a voluminous low density foam which quickly became rigid. The above foam is useful as a thermal insulator.

EXAMPLE 12

There was added to 91 parts of the epoxy resin of Example 11, to 6 parts of a 50% solution of diphenyliodonium hexafluoroarsenate in propylene carbonate and 3 parts of stannous octoate. The resulting mixture was vigorously stirred and divided into 10 part aliquots to which various copper compounds were added respectively in 0.1 part amounts. The resulting mixtures were then stirred and allowed to rest under atmospheric conditions. Table III shows the gel time obtained in minutes which were obtained from each of the mixtures containing a particular copper compound:

TABLE III

| Copper Compound | Gel Time (min) |
|---|---|
| copper naphthenate | 0.8 |
| copper benzoate | 15.5 |
| copper salicylate | 12.4 |
| copper acetylacetonate | 16.4 |
| copper stearate | 47.5 |

The above results show that the effectiveness of copper compounds as redox catalysts can vary widely.

EXAMPLE 13

A mixture was stirred consisting of 5 parts of epichlorohydrin, 0.25 part of diphenyliodonium hexafluoroarsenate, 0.2703 part of stannous octoate and 0.025 part of copper benzoate. Exothermic polymerization was immediately observed and after 5 minutes the mixture was poured into about 100 parts of methanol. There was obtained about 3 parts of polyepichlorohydrin rubber.

EXAMPLE 14

A mixture of 100 parts of ERL4221, the epoxy resin of Example 8, 3 parts of diphenyliodonium hexafluorophosphate, 3 parts of benzoin and 0.1 part of copper naphthenate as a 12% dispersion in mineral oil were thoroughly stirred together. The mixture was quickly poured into a silicone mold at 35° C. The mixture was found to harden within 5 minutes resulting in the production of a finished part which was removed from the mold.

EXAMPLE 14

A mixture of 5 parts of ε-caprolactone, 0.21 part of diphenyliodonium hexafluoroarsenate, 0.093 part of benzoin and 0.21 part of copper benzoate was placed in a sealed container. The sealed mixture was then heated at 50° C. for 30 minutes in a water bath and thereafter poured into 100 parts of methanol. A product precipitated which was filtered, washed with methanol and then dried. There was obtained 4.4 parts, or an 88% yield of polycaprolactone based on method of preparation.

EXAMPLE 15

The procedure of Example 14 was repeated, except that ε-caprolactone was replaced with 2-chloroethylvinyl ether. After the mixture was allowed to stand for 1 hour at room temperature, rapid exothermic polymerization occurred. There was obtained a low molecular weight poly-2-chloroethylvinyl ether, based on method of preparation.

EXAMPLE 16

There was added with stirring to a mixture of 70 parts of ERL4221 and 0.1 part of copper naphthenate as a 12% solution of mineral oil, 3 parts of benzoin and 3 parts of diphenyliodonium hexafluorophosphate dissolved in about 25 parts of acetone. The resulting mixture was thoroughly stirred and then allowed to rest under atmospheric conditions. Within 5 minutes, rapid polymerization occurred along with simultaneous vaporization of the acetone resulting the production of a low density closed-cell rigid foam. It is found that the resulting foam is useful as a thermal insulator.

The above procedure was repeated except that addition to the above ingredients there was initially utilized in the mixture 30 parts of a hydroxy terminated polyester (Hooker Company Rucoflex R2018). There was obtained a flexible foam which was found to be suitable for furniture and automotive padding.

EXAMPLE 17

A solution of 91 parts of ERL4221 epoxy resin, 3 parts of benzoin and 3 parts of diphenyliodonium hexafluoroarsenate was divided into 10 aliquots. There was then added to each 10 part aliquot at 40°–45° C., increments of copper naphthenate as a 12% solution in mineral oil. Each of the resulting mixtures was thoroughly stirred and gel times were noted. The following results were obtained, where the amounts of copper naphthenate are shown in parts:

TABLE IV

| Copper Naphthenate (parts) | Gel Time |
|---|---|
| 0.05 | 5 min, 35 sec |
| 0.15 | 5 min, 18 sec |
| 0.30 | 6 min, 5 sec |
| 0.45 | 6 min, 28 sec |
| 0.60 | 7 min, 21 sec |

The above results show that catalytic amounts of copper naphthenate achieve optimum gel times which increase as the concentration of the copper naphthenate increases.

EXAMPLE 18

A solution of 91 parts of ERL4221 epoxy resin, 3 parts of diphenyliodonium hexafluoroarsenate and 3 parts of propylene carbonate and 0.1 part of copper naphthenate as a 12% mineral oil solution was divided into 10 aliquots. Various benzoin compounds were then evaluated at 0.1 part levels utilizing the aforementioned 10 part aliquots. The following gel times were recorded at 25° C.

| Benzoin | Gel Time |
|---|---|
| 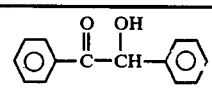 | 22 min, 7 sec |
| 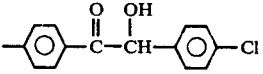 | 75 min |
| 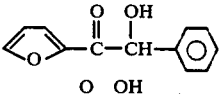 | 14 min, 40 sec |
| 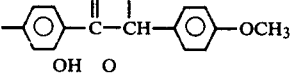 | 43 min, 26 sec |
| 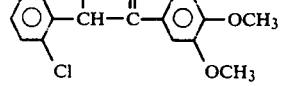 | 15 min, 8 sec |
| 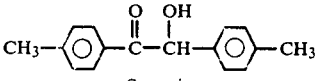 | 14 min, 50 sec |
| Stearoin | >60 min |

EXAMPLE 19

A mixture of 91 parts of the ERL4221 epoxy resin, 1 part of a copper naphthenate as a 12% solution in mineral oil and 3 parts of benzoin was divided into 10 part aliquots. Various diaryliodonium salts were then evaluated for effectiveness by utilizing them in the respective aliquots at a 0.3 part level. The following gel times were recorded:

| Diaryliodonium Salt | Gel Time |
|---|---|
| $(C_6H_5)_2I^+AsF_6^-$ | 5 min, 44 sec |
| $(p\text{-}CH_3\text{-}C_6H_4)_2I^+AsF_6^-$ | 7 min, 53 sec |
| $(p\text{-}t\text{-}but\text{-}C_6H_4)_2I^+AsF_6^-$ | 6 min, 27 sec |
| $(p\text{-}Cl\text{-}C_6H_4)_2I^+AsF_6^-$ | 8 min, 17 sec |
| $(p\text{-}CH_3\text{-}C_6H_4)_2I^+SbF_6^-$ | 5 min, 1 sec |
| $(p\text{-}CH_3\text{-}C_6H_4)_2I^+PF_6^-$ | 5 min, 26 sec |

EXAMPLE 20

A two component mixture was employed for reaction injection molding as follows:

| Component A | |
|---|---|
| Ciba Geigy CY 179 | —70 parts |
| Hooker Rucoflex F2018 Polyester | —30 parts |
| Diphenyliodonium hexafluoroarsenate (as a 50% by weight solution in propylene carbonate) | —6 parts |
| Ascorbic acid (as a 50% by weight solution in ethylene glycol) | —6 parts |
| Component B | |
| Ciba Geigy CY 179 | —70 parts |
| Hooker Rucoflex F2018 Polyester | —30 parts |
| Copper stearate | —0.5 part |

The two components were placed in a Cincinatti Millicron Reaction Injection Molding Machine and thoroughly mixed at about 25° C. Thereafter the mixture was molded into plaques 12 inches by 24 inches × ⅛ inch at a mold temperature of 82° C. Typical cure times ranged from 1–5 minutes but some plaques were produced after a cure time of 45 seconds. The samples had good integrity, gloss and appearance.

EXAMPLE 21

In accordance with the procedure of Example 20, a two component reaction injection molding formulation was prepared consisting of the following two components:

| Component A | |
|---|---|
| Silica (350 mesh) | —30 parts |
| Epon 828 | —88 parts |
| Diphenyliodonium Hexafluoroarsenate (as a 50% solution in propylene carbonate) | —6 parts |
| Stannous Octoate | —6 parts |
| Component B | |
| Silica (350 mesh) | —30 parts |
| Epon 828 | —100 parts |
| Copper Napthenate (12% Cu) | —5.0 parts |

The above two components were molded as described previously in a Cincinatti Millicron Molding Machine at 177° C. Molded plaques were obtained in 3 minute mold cycles which had good hot rigidity, gloss and mechanical properties.

The above formulation could also be successfully molded replacing the particulate silica with an equivalent amount of ⅛ inch milled glass fiber. Plaques were obtained with good surface and mechanical properties.

Although the above examples are directed to only a few of the very many variables which can be employed in the practice of the method of the present invention, as well as to the wide variety of curable compositions resulting therefrom, it should be understood that a much broader variety of cationically polymerizable materials can be utilized in combination with diaryliodonium salts, copper salts and ascorbic acid derivatives as set forth in the description preceding these examples.

What I claim as new and desire to secure by Letters Patent of the United States is:

1. A method for molding a shaped part from a cationically polymerizable organic material which comprises
   (1) blending under reaction injection molding conditions a mixture comprising
      (E) a cationically polymerizable organic material, and
      (F) an effective amount of a catalyst comprising
         (vii) a diaryl iodonium salt,
         (viii) 0.1 to 10 parts, per part of (vii) of a copper salt and
         (ix) 0.5 part to 10 parts, per part of (iv) of a reducing agent,
   (2) injecting the resulting mixture of (1) into a heated mold and
   (3) recovering the molded part resulting from step (2).

2. A method in accordance with claim 1, where the cationically polymerizable organic resin is an epoxy resin.

3. A method in accordance with claim 1, where the cationically polymerizable organic resin is a mixture of an epoxy resin and a hydroxy terminated polyester.

4. A method in accordance with claim 1, where the copper salt is copper napthenate.

5. A method in accordance with claim 1, where the diaryliodonium salt is diphenyliodonium hexafluoroarsenate.

6. A method in accordance with claim 1, where the reducing agent is fructose.

7. A method in accordance with claim 1, where the reducing agent is stannous octoate.

8. A method in accordance with claim 1, where the diaryliodonium salt is diphenyliodonium hexafluorophosphate.

* * * * *